United States Patent
Yamada et al.

(10) Patent No.: US 8,072,713 B2
(45) Date of Patent: Dec. 6, 2011

(54) MAGNETIC READING HEAD AND MAGNETIC RECORDING APPARATUS

(75) Inventors: Masaki Yamada, Sendai (JP); Hiromasa Takahashi, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 860 days.

(21) Appl. No.: 12/155,084

(22) Filed: May 29, 2008

(65) Prior Publication Data

US 2009/0034131 A1 Feb. 5, 2009

(30) Foreign Application Priority Data

Aug. 2, 2007 (JP) ................................. 2007-202224

(51) Int. Cl.
*G11B 5/39* (2006.01)
(52) U.S. Cl. .................................................. 360/324.2
(58) Field of Classification Search ............. 360/119.02, 360/119.04, 314, 319, 322, 324, 324.1, 324.11, 360/324.12, 324.2
See application file for complete search history.

(56) References Cited

U.S. PATENT DOCUMENTS

| 7,209,328 B2 | 4/2007 | Ito et al. | |
| 7,253,995 B2 * | 8/2007 | Takahashi et al. | 360/324.2 |
| 7,280,322 B2 | 10/2007 | Takahashi et al. | |
| 7,298,597 B2 * | 11/2007 | Carey et al. | 360/324.2 |
| 7,522,392 B2 * | 4/2009 | Carey et al. | 360/324.2 |
| 7,755,929 B2 * | 7/2010 | Inomata et al. | 365/158 |
| 2005/0111138 A1 | 5/2005 | Yamakawa et al. | |
| 2007/0253116 A1 * | 11/2007 | Takahashi | 360/313 |

FOREIGN PATENT DOCUMENTS

| JP | 2004-348850 | 5/2003 |
| JP | 4029772 | 5/2003 |

OTHER PUBLICATIONS

F.J. Jedema et al.; "Electrical Detection of Spin Precession in a Metallic Mesoscopic Spin Valve"; Nature, vol. 416, Apr. 18, 2002; pp. 713-716, www.nature.com.
F.J. Jedema et al.; "Spin Injection and Spin Accumulation in All-Metal Mesoscopic Spin Valves"; Physical Review B, vol. 67, 2003, pp. 085319-1 to 085319-16.
Mark Johnson et al.; "Interfacial Charge-Spin Coupling: Injection and Detection of Spin Magnetization in Metals"; Physical Review Letters, vol. 55, No. 17, Oct. 21, 1985, pp. 1790-1793.
S. Takahashi et al.; "Spin Injection and Detection in Magnetic Nanostructures"; Physical Review B, vol. 67, 2003, pp. 052409-1 to 052409-4.

* cited by examiner

*Primary Examiner* — Angel A. Castro
(74) *Attorney, Agent, or Firm* — Stites & Harbison PLLC; Juan Carlos A. Marquez, Esq.

(57) ABSTRACT

To provide a magnetic reading head that features high resolution and low noise, and that can support a hard disk with terabit-level surface recording density. A current is caused to flow from a pinned layer with its magnetization direction fixed by an antiferro magnetic material, to a non-magnetic thin wire having a portion affected by an external magnetic field and a portion not affected by the external magnetic field, so that spin polarized electrons are accumulated in the non-magnetic thin wire. A distance between voltage terminals of a voltmeter is set to less than the spin diffusion length of the non-magnetic thin wire. A change in the external magnetic field modulates some of the accumulated spin polarized electron, but does not others. Accordingly, an electrical potential difference depending on the external magnetic field is generated between the both end surfaces of the non-magnetic thin wire, and measured with the voltmeter.

12 Claims, 7 Drawing Sheets

MAGNETIC READING HEAD AND MAGNETIC RECORDING APPARATUS

CLAIM OF PRIORITY

The present application claims priority from Japanese application JP 2007-202224 filed on Aug. 2, 2007, the content of which is hereby incorporated by reference into this application.

BACKGROUND OF THE INVENTION

1. Field of the Invention

The present invention relates to a magnetic reading head including a magnetoresistance effect device and a magnetic recording apparatus equipped with the magnetic reading head.

2. Description of the Related Art

Heretofore, magnetic recording and reproducing apparatuses have been improved in recording density at a rate of more than 40% a year, and it is estimated that the recording density will reach the order of Tbit/in$^2$ around the year of 2011 at the present rate of growth. Such a terabit-level magnetic recording apparatus needs to be equipped with a magnetic writing and reading head with higher output and higher resolution than ever.

As an elemental technique for an existing magnetic recording and reproducing apparatus, a current perpendicular to plane giant magneto resistance (CPP-GMR) head and a tunneling magneto resistance (TMR) head have been proposed. In each of these spin valve reading heads, a sense current is caused to flow perpendicular to the stacked-layer surface thereof, and a leakage magnetic field from a medium is detected by using a magnetic material (free layer). Specifically, each spin valve reading head shows a resistance change based on a magnetization direction of the free layer relative to the fixed magnetization direction of a magnetic material (pinned layer).

SUMMARY OF THE INVENTION

Each of the existing CPP-GMR head and TMR head needs to consist of thinner films in order to achieve higher resolution. Especially, as the bit length becomes shorter, such a head needs to have a more minimized gap width $G_w$ to achieve high resolution. For example, the gap width $G_w$ of the reading head supporting the Tbit/in$^2$-level recording medium is approximately 25 nm. This means that the films constituting the device of the head need to have a total thickness not more than 25 nm. This makes magnetization of the magnetic material unstable in each of the existing CPP-GMR head and TMR head, even at room temperature. Incidentally, the thermal stability of a magnetic material is estimated using the expression of $K_u V/k_B T$, where $K_u$ is a uniaxial magnetic anisotropic energy, V is the volume of the magnetic material, $k_B$ is Boltzmann constant, and T is a temperature. If the value of the expression becomes not more than 100, the thermal fluctuation in the magnetic material makes it difficult to maintain magnetization thereof. Accordingly, decrease in volume of the magnetic material destabilizes magnetization thereof unstable, and thus is expected to increase magnetic noise. This reduces the S/N ratio of the reading head, and thus makes it difficult for the reading head to read a hard disk with ultra-high recording density.

The present invention aims to provide such a magnetic reading head with high resolution and low noise that is capable of supporting a hard disk with terabit-level surface recording density.

In the present invention, as a free layer facing a recording medium, a non-magnetic metal is used in place of a magnetic material that has been conventionally used. By employing a non-magnetic metal as the free layer, the present invention makes it possible to detect a leakage magnetic field by utilizing a spin accumulation effect. The spin accumulation effect is a phenomenon that spin-polarized electrons are accumulated in a non-magnetic metal within the spin diffusion length of the electrons while a current is caused to flow from a ferromagnetic material to the non-magnetic metal. Here, the spin diffusion length means a distance at which information on a spin becomes vanished (a spin direction is reversed), and is an intrinsic value to a material. In general, a ferromagnetic material has an unbalanced spin density (the number of up-spin polarized electrons and that of down-spin polarized electrons are different) at the Fermi level. Accordingly, when a current is caused to flow from a ferromagnetic material to a non-magnetic metal, spin polarized electrons are injected into the non-magnetic metal. The spin accumulation effect is caused by a difference in chemical potential between the thus-accumulated up-spin polarized electrons and down-spin polarized electrons, in the non-magnetic metal. The accumulated spin polarized electrons cause the non-magnetic material to act like a ferromagnetic material, within the spin diffusion length of the electrons, and thus are affected by the direction and strength of the external magnetic field (refer to Nature, vol. 416 (2002), pp. 713-716, and Phys. Rev. B, vol. 67, (2003), pp. 85319-85319(16).).

An effect that a magnetic field suppresses electron spins in a magnetic material is known as a Hanle effect (refer to Phys. Rev. Lett. 55, 1790-1793 (1985).), and an effect similar to the Hanle effect is expected to act on spin polarized electrons accumulated in a non-magnetic material. For example, in the case where an external magnetic field is applied to a non-magnetic material in a direction perpendicular to a polarization direction of spin polarization electrons therein, the magnetic field forces the spin polarized electrons to precess. During precession, the spin polarized electrons are turning to be polarized in that perpendicular direction, so that the density of the spin polarized electrons in the original polarization direction is reduced in the non-magnetic material.

In view of these circumstances, a magnetic reading head according to the present invention has a structure including a non-magnetic material caused, by utilizing a spin accumulation effect, to have one portion affected by a leakage magnetic field from a recoding medium and the other portion not affected by the leakage magnetic field. The magnetic reading head functions as an external magnetic field sensor by detecting an electrical potential difference between these portions. Specifically, the density of the spin polarized electrons changes in one portion affected by the leakage magnetic field as described above, while being constant in the other portion not affected by the leakage magnetic field. Thus, a chemical potential generated by the spin polarized electrons changes depending on the leakage magnetic field. This change in chemical potential can be detected as an electrical potential difference, so that magnetic reading head functions as an external magnetic field sensor.

A magnetic reading head according to the present invention includes: a non-magnetic material having a first portion affected by an external magnetic field and a second portion not affected by the external magnetic field; a magnetic material stacked on a connection region between the first and second portions of the non-magnetic material; a means for accumulating spin polarized electrons in the first and second portions of the non-magnetic material by causing a current to flow from the magnetic material to the non-magnetic material; and a voltage detection means for detecting a voltage between the first and second portions.

As an aspect of the present invention, the magnetic reading head may have the following configuration. Specifically, the magnetic reading head further includes first to third magnetic shields. The first magnetic shield is disposed in a side opposite to a side in which the magnetic material is stacked, relative to the non-magnetic material, and connected to the non-magnetic material in a region corresponding to a back side of the magnetic material. The second magnetic shield is disposed in the side in which the magnetic material is stacked, relative to the non-magnetic material, and connected to the first portion of the non-magnetic material. The third magnetic shield is disposed in the side in which the magnetic material is stacked, relative to the non-magnetic material, and connected to the second portion of the non-magnetic material. Additionally, the non-magnetic material is disposed such that the first portion is placed closer to the medium-facing surface and that the second portion is placed farther from the medium-facing surface. A current is caused to flow from the magnetic material to the first shield connected to the non-magnetic material. The voltage detection means detects a voltage between the second and third magnetic shields.

As another aspect of the present invention, the magnetic reading head may have the following configuration. Specifically, the magnetic reading head further includes a first magnetic shield and a second magnetic shield. The first magnetic shield is disposed in a side to the first portion of the non-magnetic material so as to fill a space adjacent to the second portion and closer to a medium, the first magnetic shield connected to the non-magnetic material. The second magnetic shield is disposed in a side to the first portion of the non-magnetic material such that the first portion is sandwiched between the first and second magnetic shields. Additionally, the non-magnetic material is disposed such that the first portion is placed closer to the medium-facing surface and that the second portion is placed so as to extend along the medium-facing surface. A current is caused to flow from the magnetic material to the non-magnetic material. The voltage detection means detects a voltage between the second portion of the non-magnetic material and the first magnetic shield.

The present invention makes it possible to suppress the increase in magnetic noise along with the reduction in volume of a free layer by employing a non-magnetic material as a material of the free layer. Moreover, the present invention makes it possible to reduce electrical noise generated during voltage measurement since a current is caused not to flow through a sensing portion of the free layer. Incidentally, an output voltage based on the spin accumulation effect is inversely proportional to a cross-sectional area of a non-magnetic material portion (refer to Phys. Rev. B, vol. 67, (2003), pp. 52409(1)-52409(4).). Accordingly, unlike output voltages based on a CPP-GMR effect and a TMR effect which are conventionally used, an output voltage based on the spin accumulation effect increases if the cross-sectional area of the free layer (non-magnetic material) facing a medium is reduced.

As described above, the present invention makes it possible to implement a magnetic reading head supporting a terabit-level magnetic recording apparatus and having high sensitivity, high resolution and low noise.

DESCRIPTION OF THE PREFERRED EMBODIMENT

Hereinafter, detailed description will be given of a magnetic head to which the present invention is favorably applied.

Figure 1:
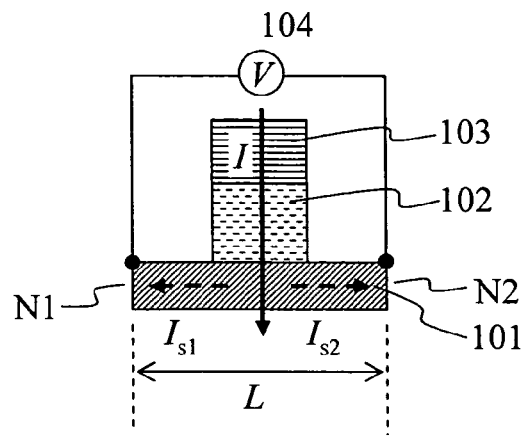
FIG. 1 is a schematic view showing an example configuration of a magnetic reading head in which a first modulated spin accumulation device by magnetic field is used.

FIG. 1 is a schematic view showing an example configuration of a magnetic reading head in which a spin accumulation device is used, according to the present invention. This magnetic reading head includes a non-magnetic material (non-magnetic thin wire) 101, and an antiferro magnetic material 103 which is stacked on the non-magnetic thin wire 101 with a magnetic metal 102 disposed therebetween. The magnetic metal 102 is in contact with the non-magnetic thin wire 101 only at a central portion thereof. Note that the magnetic metal 102 is caused to have a fixed magnetization direction and functions as a pinned layer when it has a synthetic ferri-structure or when an antiferro magnetic material is stacked thereon. Although the structure in which the antiferro magnetic material 103 is stacked on the magnetic metal 102 is shown herein for simplicity, a method of causing the magnetic metal 102 to have a fixed magnetization direction is not particularly limited to this. A synthetic ferri-structure or the like may also be employed instead. The magnetic metal 102 serves as a spin injection source which is caused to have a fixed magnetization direction by the antiferro magnetic material 103. When a current I is caused to flow from the magnetic metal 102 to the non-magnetic thin wire 101, spin polarized electrons $I_{s1}$ and $I_{s2}$ are injected into the non-magnetic thin wire 101, and accumulated therein within a spin diffusion length $\lambda$. The spin polarized electrons $I_{s1}$ are diffused in the non-magnetic thin wire 101 in the left direction of FIG. 1 and accumulated therein while the spin polarized electrons $I_{s2}$ are diffused in the non-magnetic thin wire 101 in the right direction of FIG. 1 and accumulated therein. Here, it is assumed that the spin polarized electrons $I_{s1}$ are affected by an external magnetic field through a surface N1 while the spin polarized electrons $I_{s2}$ are not affected by the external magnetic field through a surface N2. Here, a length of a voltage measurement path is assumed to be L, and voltage terminals of a voltmeter 104 are placed within a distance less than twice the spin diffusion length $\lambda$ (L<$2\lambda$). Thereby, it is possible to obtain an output caused by a change in the external magnetic field by measuring an electrical potential difference between the spin polarized electrons $I_{s1}$ and $I_{s2}$ with the voltmeter 104 under this condition. Note that the current I caused to flow from the magnetic metal 102 to the non-magnetic thin wire 101 does not flow through the surfaces N1 and N2.

The non-magnetic thin wire 101 may either be made of a non-magnetic conductive metal, such as Cu, Au, Ag, Pt, Al, Pd, Ru, Ir or Rh, or be made of a conductive compound mainly containing GaAs, Si, TiN, TiO or $ReO_3$. The spin diffusion lengths $\lambda$ are intrinsic to the respective materials, and the distance between the electrodes L is set to be less than twice the spin diffusion length $\lambda$ of the material employed for the non-magnetic thin wire 101. For example, when the non-magnetic thin wire 101 is made of Cu, L<700 nm should be satisfied. Meanwhile, when the non-magnetic thin wire 101 is made of Al, L<1200 nm should be satisfied.

As the magnetic metal 102, Co, Ni, Fe or Mn may be used, or alternatively an alloy or a compound mainly containing at least one of these elements may also be used. Instead, the magnetic metal 102 may also contain: an oxide having a structure of $AB_2O_4$ (A represents at least one of Fe, Co and Zn, and B represents one of Fe, Co, Ni, Mn and Zn) typified by half-metal $Fe_3O_4$; a compound in which at least one of transition metals Fe, Co, Ni, Cr, and Mn is added to $CrO_2$, CrAs, CrSb or ZnO; or a Heusler alloy of a $C_2D \times E_1 \times F$ type (C consists of at least one of Co, Cu and Ni; D and E each represent one of Mn, Fe and Cr; and F represents a material including at least one of Al, Sb, Ge, Si, Ga, and Sn) typified by $Co_2MnGe$, $Co_2MnSb$, $Co_2Cr_{0.6}Fe_{0.4}Al$ and the like. As the antiferro magnetic metal 103, MnIr, MnPt, MnRh or the like may be used.

Incidentally, if a barrier layer is formed on the non-magnetic thin wire 101 and thereby a structure is employed in which the non-magnetic thin wire 101 is in contact with the magnetic metal 102 with the barrier layer interposed therebetween, effective spin polarizability is improved and consequently an output signal from the magnetic reading head is amplified. The barrier layer may be either a single-layer film or a multilayer film which is made of a material containing at least one of MgO, $Al_2O_3$, AlN, $SiO_2$, $HfO_2$, $Zr_2O_3$, $Cr_2O_3$, $TiO_2$ or $SrTiO_3$.

Figure 2:
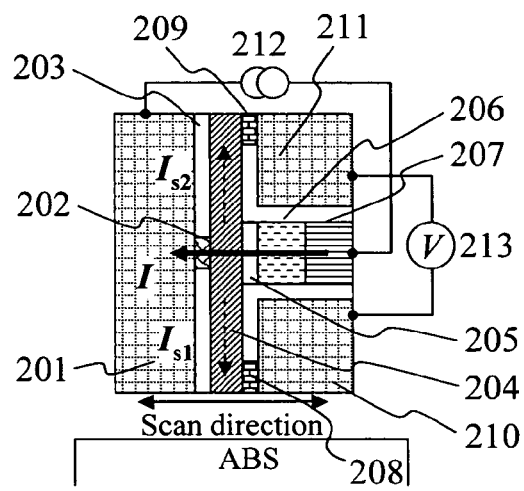
FIG. 2 is a schematic view showing an example configuration of a magnetic reading head in which a second modulated spin accumulation device by magnetic field is used.

FIG. 2 is a schematic view showing an example configuration of a magnetic reading head in which a second modulated spin accumulation device by magnetic field is used, according to the present invention. The second modulated spin accumulation device by magnetic field consists of one portion affected by the external magnetic field and the other portion not affected by the external magnetic field. Reference numerals 201, 210 and 211 respectively represent first to third magnetic shields made of a high permeable magnetic material (soft iron, ferrite, permalloy or the like). A non-magnetic thin wire 204, a barrier layer 205, a pinned layer 206, an antiferro magnetic layer 207 are made of the aforementioned materials as ones for the non-magnetic thin wire 101, the barrier layer, the magnetic metal 102, the antiferro magnetic metal 103, respectively. The pinned layer 206 is in contact with the non-magnetic thin wire 204 only at a central portion thereof, with the barrier layer 205 interposed therebetween. A region, opposite to the barrier layer 205, of the non-magnetic thin wire 204 is electrically connected to the first magnetic shield 201 through a first contact portion 202. The second and third magnetic shields 210 and 211 are electrically connected to the both ends of the non-magnetic thin wire 204 through second and third contact portions 208 and 209, respectively. Between the antiferro magnetic layer 207 and the first magnetic shield 201, a current source 212 is connected. Note that, a current from the current source 212 flows into the non-magnetic thin wire 204 through the pinned layer 206, and thereafter flows through the first contact portion 202 and returns to the current source 212 as shown by the solid arrow, without flowing through the second and third contact portions 208 and 209.

As a material of the first contact portion 202 that electrically connects the first magnetic shield 201 and the non-magnetic thin wire 204, a material having a longer spin diffusion length than those of the second and third contact portions 208 and 209 is selected. For example, Al ($\lambda$=600 to 1000 nm) is used for the first contact portion 202, while Au ($\lambda$=100 to 200 nm) is used for the second and third contact portions 208 and 209. This is to ensure that a spin sink effect (refer to Appl. Phys. Lett., vol. 85, (2004), pp. 3795-3796.) to the first magnetic shield 201 during spin polarized electron injection is suppressed and that thereby spin polarized electrons is effectively accumulated in the non-magnetic thin wire 204.

The non-magnetic thin wire 204, the pinned layer 206 and the antiferro magnetic material 207 are electrically insulated from one another except for the contact portions, by the magnetic shield 201, 210 and 211, and an interlayer insulator ($Al_2O_3$). When the current source 212 supplies a current I to the first magnetic shield 201 through the antiferro magnetic material 207, spin polarized electrons $I_{s1}$ and $I_{s2}$ are accumulated in the non-magnetic thin wire 204. Here, the spin polarized electrons $I_{s1}$ diffuse in the direction toward the medium-facing surface while the spin polarized electrons $I_{s2}$ diffuse in the direction opposite to the medium-facing surface. When the constant current I is continuously applied, the distribution of the spin polarized electrons $I_{s1}$ varies in a manner depending on a leakage magnetic field from the recording medium, while the distribution of the spin polarized electrons $I_{s2}$ is prevented from depending on the leakage magnetic field by the magnetic shields, and thus being constant irrespective of the leakage magnetic field. Since the output voltage caused by the spin accumulation effect depends on the density of spin polarized electrons, the output voltage in the side not facing the medium-facing surface is constant irrespective of the magnetic field while the output voltage in the side facing the medium-facing surface varies in a manner depending on the magnetic field. In other words, a voltage difference depending on the magnetic field is generated between the portion not facing the medium-facing surface and the portion facing the medium-facing surface in the non-magnetic thin wire 204. Accordingly, it is possible to detect the leakage magnetic field by measuring this electrical potential difference. Note that the electrical potential difference is detected with a voltmeter 213 connected to the second and third magnetic shields 210 and 211. In this way, a magnetic reading head in which one end of the non-magnetic thin wire 204 serves as a sensing portion (free layer) is provided.

Figure 3:
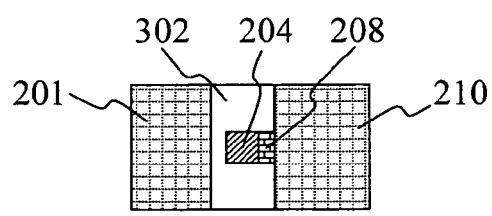
FIG. 3 is a schematic view of the magnetic reading head shown in FIG. 2 as viewed from a medium-facing surface.

FIG. 3 is a schematic view of the magnetic reading head shown in FIG. 2 as viewed from the medium-facing surface. The magnetic reading head has a structure in which an end surface of the non-magnetic thin wire 204 is exposed between the first and second magnetic shields 201 and 210. The non-magnetic thin wire 204 is electrically connected to the second magnetic shield 210 through the second contact portion 208. Further, the non-magnetic thin wire 204 and the magnetic shields 201 and 210 are electrically insulated from one another except for the contact portions, by an interlayer insulating film 302. In FIG. 3, the sensing portion facing the recording medium, that is, the end surface of the non-magnetic thin wire 204 has a rectangular shape, as an example. However, the shape of the end surface can be changed according to a shape of a track of a recording medium.

FIGS. 4A to 4F are schematic cross-sectional views illustrating manufacturing steps of the magnetic reading head shown in FIG. 2.

Figure 4A:
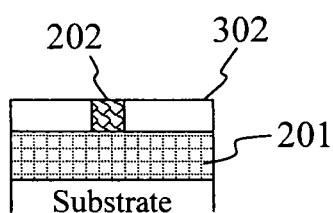
FIGS. 4A to 4F are views illustrating manufacturing steps of the magnetic reading head in which the second modulated spin accumulation device by magnetic field is used.

As shown in FIG. 4A, in a first step, the first magnetic shield 201 and the first contact portion 202 are formed. Specifically, the first magnetic shield 201 is formed on a substrate, and then the interlayer insulating film 302 is stacked thereon. Thereafter, a pattern for the first contact portion 202 is formed by electron beam drawing and an exposure with an I-line stepper, and thus the first contact portion 202 is formed.

Figure 4B:
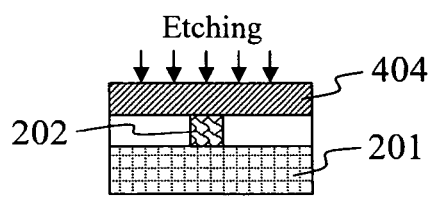

As shown in FIG. 4B, in a second step, the non-magnetic thin wire 204 is formed. Specifically, on the interlayer insulating film 302, stacked is a non-magnetic film 404 to be formed into the non-magnetic thin wire 204 having an end which functions as a free layer. The non-magnetic film 404 is then finely processed into a thin wire pattern. Thereafter, the non-magnetic thin wire 204 is covered with the interlayer insulating film 302, and the upper surface of the non-magnetic thin wire 204 is made exposed by lift-off technique.

Figure 4C:
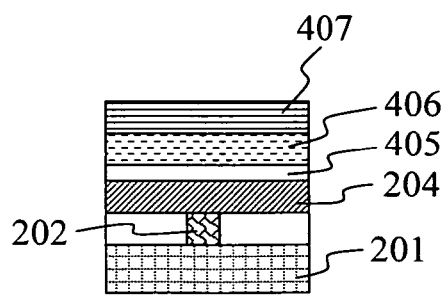

As shown in FIG. 4C, in a third step, a pinned layer 206 is formed. Specifically, on the non-magnetic thin wire 204 formed in the second step, an insulating film 405 to be formed into the barrier layer 205, a magnetic film 406 to be formed in to the pinned layer 206, and a film 407 to be formed into the antiferro magnetic layer 207 are sequentially stacked.

Figure 4D:
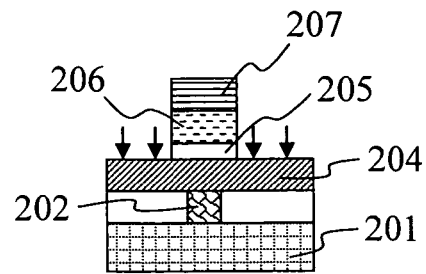

As shown in FIG. 4D, in a fourth step, the pinned layer 206 is finely patterned. Through the fourth step, the barrier layer 205, the pinned layer 206 and the antiferro magnetic layer 207 are formed.

Figure 4E:
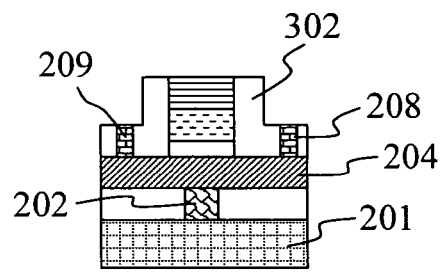

As shown in FIG. 4E, in a fifth step, formed are the contact portions to be electrically connected to the second and third magnetic shields 210 and 211, respectively. Specifically, the surrounding regions of the pinned layer 206 formed in the fourth step are covered with the interlayer insulating film 302, and contact holes are formed therein. Subsequently, the second and third contact portions 208 and 209 are formed in the contact holes.

Figure 4F:
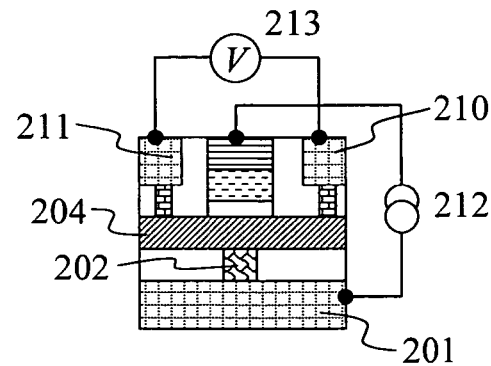

As shown in FIG. 4F, in a sixth step, the second and third magnetic shields 210 and 211 are formed, and the current source 212 and the voltmeter 213 are connected to the magnetic reading head.

Figure 5:
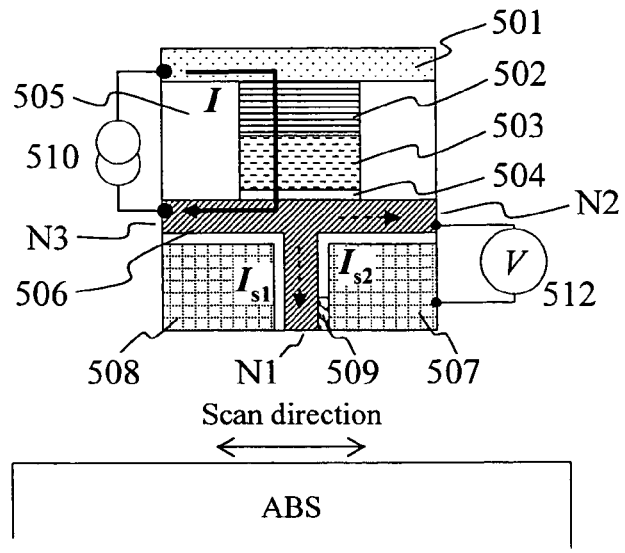
FIG. 5 is a schematic view showing an example configuration of a magnetic reading head in which a third modulated spin accumulation device by magnetic field is used.

FIG. 5 is a schematic view showing an example configuration of a magnetic reading head in which a third modulated spin accumulation device by magnetic field is used. The third modulated spin accumulation device consists of a portion affected by the external magnetic field and a portion not affected by the external magnetic field. In the magnetic reading head, a barrier layer 504, a pinned layer 503, an antiferro magnetic layer 502 and an electrode 501 are sequentially stacked on a non-magnetic thin wire 506 that has a T-shaped structure extending in three directions. The non-magnetic thin wire 506, the barrier layer 504, the pinned layer 503 and the antiferro magnetic layer 502 are made of the aforementioned materials as ones for the non-magnetic thin wire 101, the barrier layer, the magnetic metal 102, the antiferro magnetic material 103, respectively. Among three thin wire portions connected to have a T-shaped structure, the thin wire portion in the side closer to the medium-facing surface is assumed to be N1, the thin wire portion in the side closer to a voltage terminal is assumed to be N2, and the thin wire portion in the side closer to a current terminal is assumed to be N3. The thin wire portion N1 extends, to the medium-facing surface, from a connection point where the three thin wire portions are connected together, while the thin wire portions N2 and N3 extend horizontally from the connection point of the three thin wire portions in opposite directions to each other.

A first magnetic shield 507 is placed so as to fill a space (reading side) adjacent to the thin wire portion N2 and near the medium, while a second magnetic shield 508 is placed so as to fill a space (trailing side) adjacent to the thin wire portion N3 and near the medium. Thereby, the external magnetic field leaked from the medium is prevented from reaching the thin wire portions N2 and N3 and is caused to reach only the thin wire portion N1. The first magnetic shield 507 is electrically connected to the thin wire portion N1 through a contact portion 509. A current source 510 is connected to the electrode 501 and the thin wire portion N3, and thereby a current is caused to flow from the antiferro magnetic material 502 to the thin wire portion N3. While the current is flowing, the spin polarized electrons are injected into the non-magnetic thin wire 506, and the spin polarized electrons $I_{s1}$ diffuse toward the thin wire portion N1 and are accumulated therein while the spin polarized electrons $I_{s2}$ diffuse toward the thin wire portion N2 and are accumulated therein. A reference numeral 505 denotes an interlayer insulating film. Note that, a current I from the current source 510 flows into the non-magnetic thin wire 506 through the pinned layer 503, and thereafter flows through the thin wire portion N3 and returns to the current source 510 as shown by the solid arrow, without flowing through the thin wire portions N1 and N2.

The distribution of the spin polarized electrons $I_{s1}$ that are accumulated in the direction of the thin wire portion N1 is modulated by the leakage magnetic field from the medium, while the first and second magnetic shields 507 and 508 prevent the distribution of the spin polarized electrons $I_{s2}$ that are accumulated in the direction of the thin wire portion N2 from being affected by the magnetic field. As a result, a change of the magnetic field causes an electrical potential difference between the thin wire portions N1 and N2. By detecting this potential difference with a voltmeter 512, a change of the leakage magnetic field is detected. The magnetic reading head with this configuration can be easily combined with a planar writing head (refer to Japanese Patent No. 3806372) that is expected as a next-generation writing head.

Figure 6:
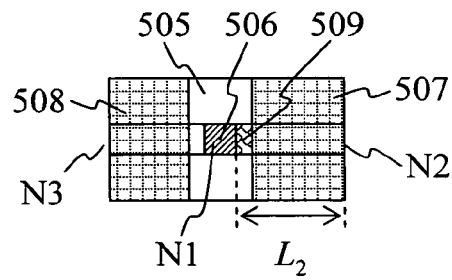
FIG. 6 is a view of the magnetic reading head shown in FIG. 5 as viewed from a medium-facing surface.
Figure 7:
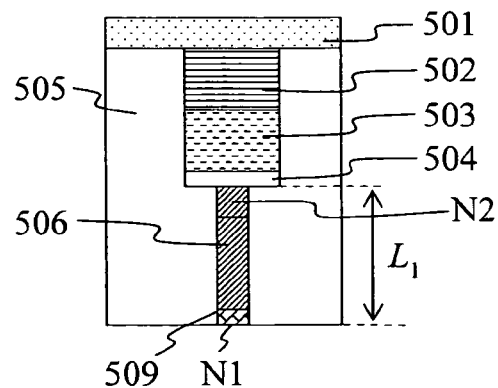
FIG. 7 is a side view of the magnetic reading head shown in FIG. 5.

FIG. 6 is a view of the magnetic reading head shown in FIG. 5 as viewed from the medium-facing surface, and FIG. 7 is a view of the magnetic reading head as viewed from the side of the thin wire portion N2, that is, from right of FIG. 5. As shown in FIG. 6, the magnetic reading head has a structure in which the thin wire portion N1 in the side, closer to the medium-facing surface, of the non-magnetic thin wire 506 is sandwiched by the first and second magnetic shields 507 and 508. When the thin wire portion N2 in the side closer to the voltage terminal is assumed to have a length $L_2$, $L_2$ is set to be shorter than the spin diffusion length of the non-magnetic thin wire 506. Moreover, as shown in FIG. 7, when the thin wire portion N1 is assumed to have a length $L_1$, $L_1$ is also set to be shorter than the spin diffusion length of the non-magnetic thin wire 506. For example, in the case where the non-magnetic thin wire 506 is made of Cu, both $L_1$ and $L_2$ are set to be not more than 300 nm. Within this length range, a spin accumulation effect causes the thin wire portions N1 and N2 of the non-magnetic thin wire 506 to act like a magnetic material. This provides the magnetic reading head with functions of detecting the leakage magnetic field from the medium.

FIGS. 8A to 8F are schematic cross-sectional views illustrating manufacturing steps of the magnetic reading head shown in FIG. 5.

Figure 8A:
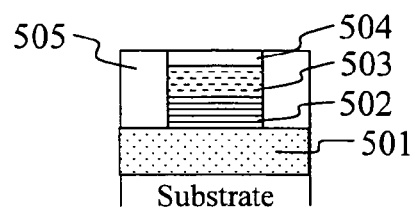
FIGS. 8A to 8F are views illustrating manufacturing steps of the magnetic reading head in which the third modulated spin accumulation device by magnetic field is used.

As shown in FIG. 8A, in a first step, the pinned layer 503 is formed. Specifically, the upper electrode 501, the antiferro magnetic layer 502, the pinned layer 503 and the barrier layer 504 are sequentially stacked on a substrate. Thereafter, a pattern for the pinned layer 503 is formed, and the surrounding regions of the pattern are covered with the interlayer insulating film 505.

Figure 8D:
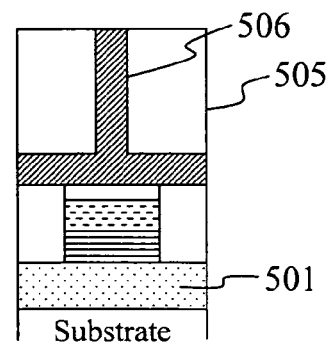
Figure 8B:
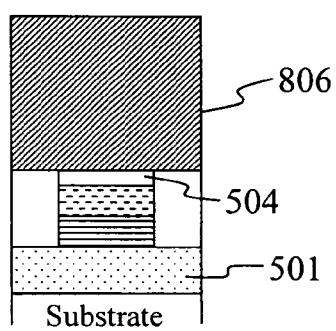
Figure 8E:
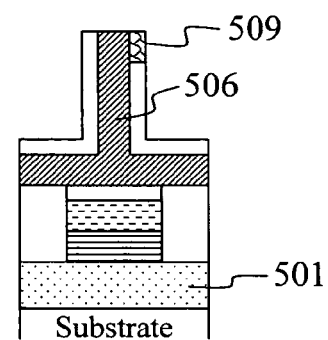
Figure 8C:
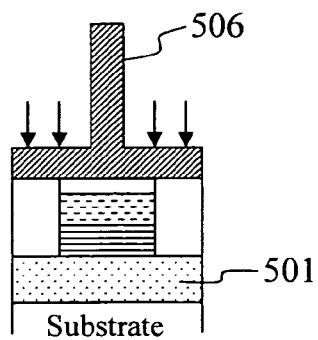

As shown in FIG. 8C, in a second step, a non-magnetic free layer is formed. Specifically, on the barrier layer 504, stacked is a non-magnetic film 806 to be formed into the non-magnetic thin wire 506 having an end which functions as a free layer.

As shown in FIG. 8C, in a third step, the non-magnetic film 806 is finely processed into a pattern for the T-shaped non-magnetic thin wire 506.

Thereafter, as shown in FIG. 8D, in a fourth step, the non-magnetic thin wire 506 is covered with the interlayer insulating film 505, and the medium-facing surface of the non-magnetic thin wire 506 is polished. In this step, the free layer is completed.

As shown in FIG. 8E, in a fifth step, patterns for the contact portion and the magnetic shields are formed in the interlayer insulating film 505, and the contact portion 509 is formed.

Figure 8F:
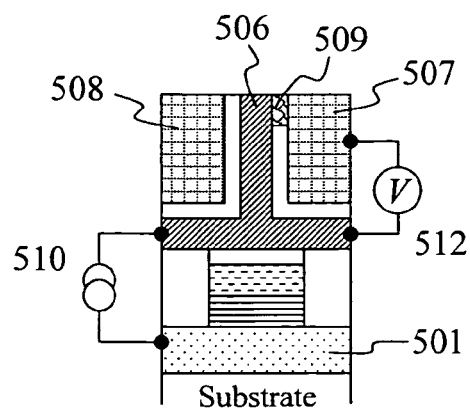

As shown in FIG. 8F, in a sixth step, the first and second magnetic shields 507 and 508 are formed, and the current source 510 and the voltmeter 512 are connected to the magnetic reading head.

Figure 9:
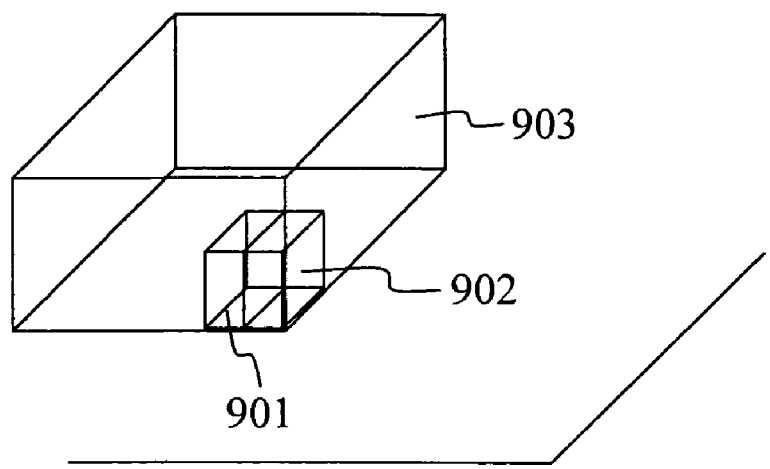
FIG. 9 is an outline view of a magnetic head which is a combination of a writing head and the magnetic reading head in which the second modulated spin accumulation device by magnetic field is used.
Figure 10:
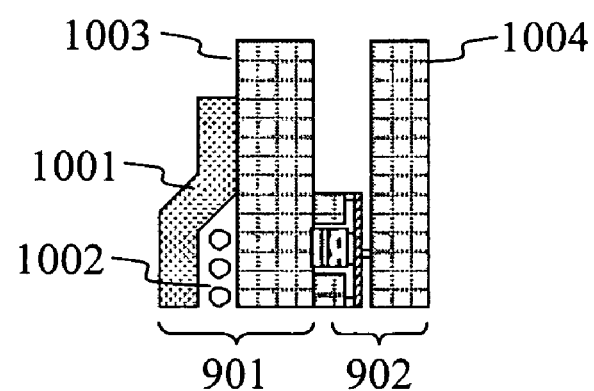
FIG. 10 is a schematic cross-sectional view of the magnetic head shown in FIG. 9.

FIG. 9 is an outline view of a magnetic head 903 which is a combination of a single pole writing head 901 and a magnetic reading head 902 that has the configuration shown in FIG. 2. FIG. 10 is a schematic cross-sectional view of the magnetic head 903 shown in FIG. 9. This magnetic head includes: the single pole writing head 901 consisting of a main pole 1001, a coil 1002 and an additional pole 1003; and the magnetic reading head 902 described with reference to FIG. 2. The magnetic reading head 902 is placed between a lower magnetic shield 1004 and the magnetic shield 1003 that also serves as the additional pole.

Figure 11:
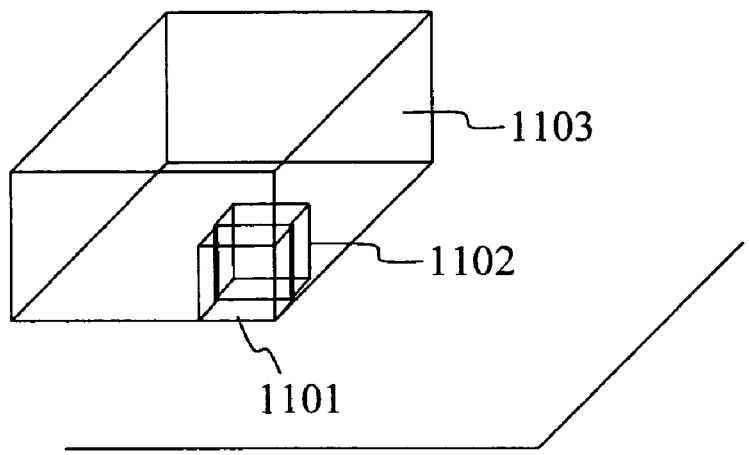
FIG. 11 is an outline view of a magnetic head which is a combination of a planar writing head and the magnetic reading head in which the third modulated spin accumulation device by magnetic field is used.
Figure 12:
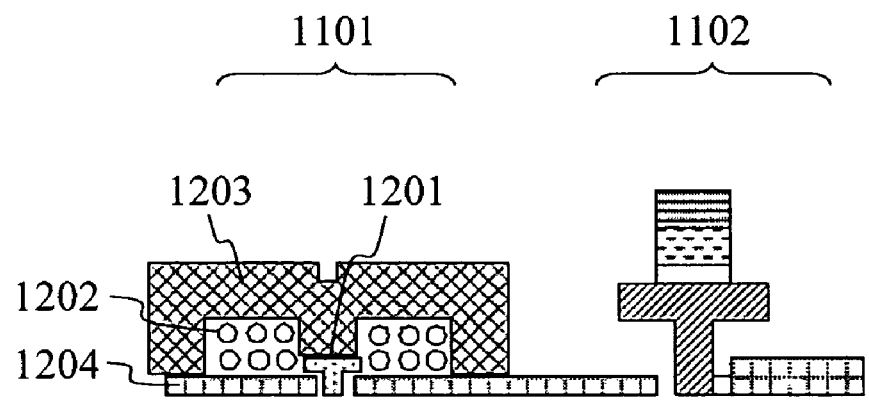
FIG. 12 is a schematic cross-sectional view of the magnetic head shown in FIG. 11.

FIG. 11 is an outline view of a magnetic head 1103 which is a combination of a planar writing head 1101 and a magnetic reading head 1102 as shown in FIG. 7. FIG. 12 is a schematic cross-sectional view of the magnetic head 1103 shown in FIG. 11. This magnetic head includes: the planar writing head 1101 consisting of a main pole 1201, a coil 1202 and an additional pole 1203; and the magnetic reading head 1102 described with reference to FIG. 5. Note that a magnetic shield 1204 is shared by the planar writing head 1101 and the reading head 1102, and has openings only in a portion facing the main pole of the writing head 1101 and in a portion facing the sensing portion of the reading head 1102.

Figure 13:
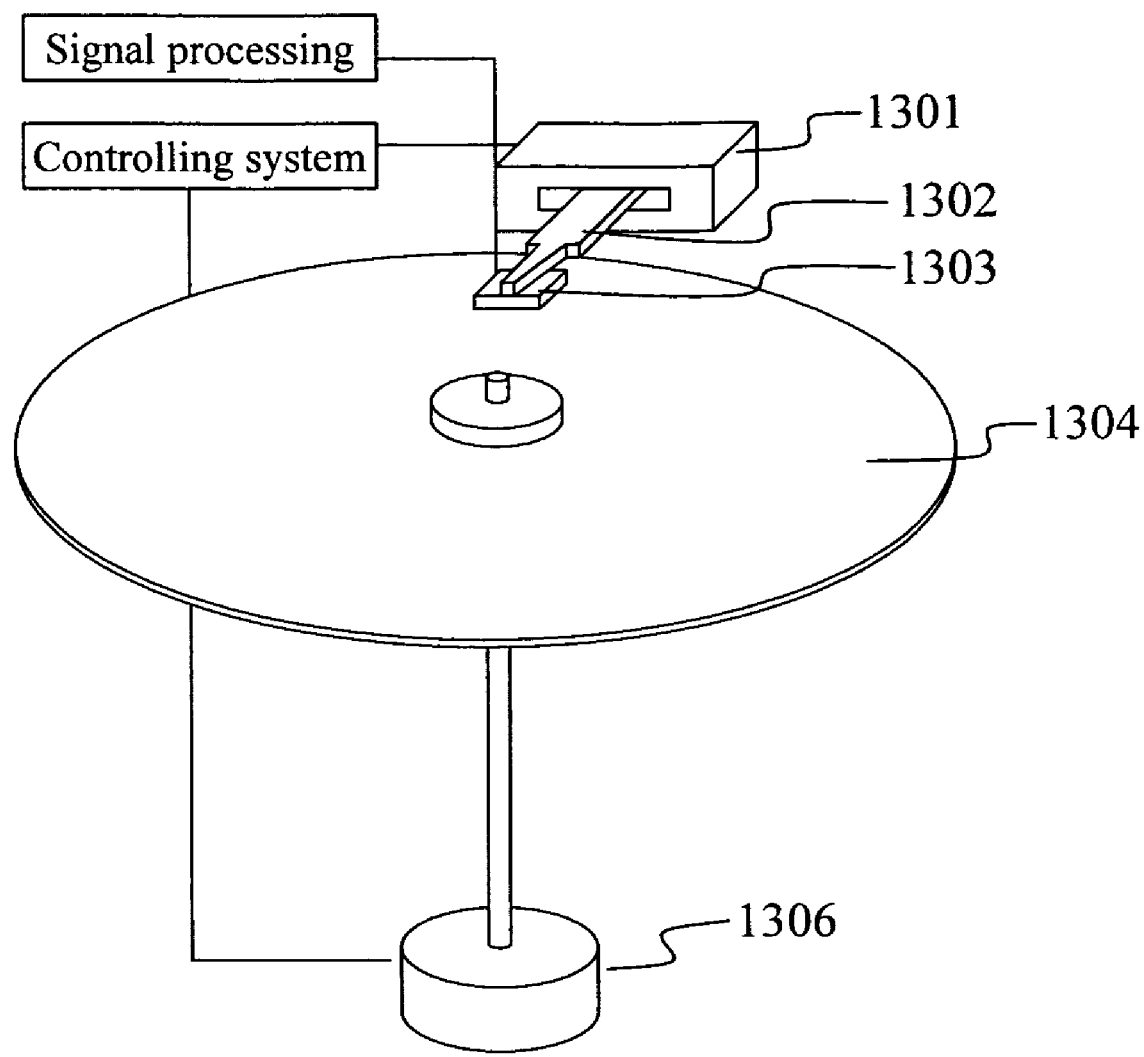
FIG. 13 is an outline view of a magnetic recording apparatus according to the present invention.

FIG. 13 is an outline view of a magnetic recording apparatus according to the present invention. This magnetic recording apparatus includes: a magnetic recording medium 1304 having a magnetic recording layer; a driving unit 1306 which drives the magnetic recording medium 1304; a magnetic head 1303 as shown in FIG. 9 or FIG. 10; an actuator 1301 and a slider 1302 which move the magnetic head 1303 to a predetermined position on the magnetic recording medium 1304; and a means for processing an output signal from the magnetic head 1303. The magnetic recording medium 1304 may be a continuous longitudinal recording medium, continuous perpendicular recording medium, a discrete magnetic recording medium or a pattern medium.

Example 1

A magnetic reading head including the second modulated spin accumulation device by magnetic field as shown in FIG. 2 was manufactured through the steps shown in FIGS. 4A to 4F. As a substrate, prepared was a commonly-used substrate on which a shield layer was formed. The commonly-used substrate was a $SiO_2$ substrate or a glass substrate (or was a magnesium oxide substrate, a GaAs substrate, an AlTiC substrate, a SiC substrate, an $Al_2O_3$ substrate or the like, instead). The shield layer was formed with a film forming apparatus using an RF sputtering method, a DC sputtering method, a molecular beam epitaxy method (MBE) or the like. For example, in the case where an RF sputtering method is employed for forming the shield layer, a predetermined film is caused to grow in an Ar atmosphere under conditions where a pressure is on the order of 0.1 to 0.001 Pa, and a power is 100 W to 500 W. As a substrate on which the device was to be formed, used was either one of the above substrates without being processed or one of the above substrates on which an insulating film, an appropriate underlaying metal film and the like were formed. The following steps 1 to 6 correspond to FIGS. 4A to 4F, respectively.

Step 1: Forming Magnetic Shields and a Contact Portion

A magnetic shield layer NiFe was formed in a thickness of 100 nm on a Si substrate of 3 inches provided with a thermal oxide film using an RF magnetron sputtering apparatus. Then, an $Al_2O_3$ film for interlayer insulation was formed in a thickness of 20 nm on the magnetic shield layer. A pattern for a contact portion was transferred onto the $Al_2O_3$ film by exposure with an I-line stepper, and thereafter a contact hole was formed in the $Al_2O_3$ film with an ion milling apparatus. As a material of the contact portion, Cu was used, so that spin polarized electrons were prevented from diffusing into the first magnetic shield layer.

Step 2: Forming a Non-magnetic Thin Wire

As the non-magnetic free layer, a Cu thin wire was employed. The Cu thin wire was 20 nm in width, 20 nm in thickness and 500 nm in length and was obtained by fine processing using electron beam drawing method. Note that the Cu thin wire was annealed in vacuo at 240° C. for 50 minutes. Through this annealing process, the particle size of Cu was successfully increased, thus the Cu thin wire with a resistance value on the order of 2 μΩcm was successfully formed despite its width of only 20 nm.

Step 3: Forming a Tunnel Junction and a Pinned Layer

An $Al_2O_3$ film for interlayer insulation and antioxidation was formed in a thickness of 20 nm in the surrounding regions of the Cu thin wire, thereby forming a tunnel junction on the Cu thin wire. Here, as a barrier layer, a film of MgO was formed in a thickness of 2 nm on the $Al_2O_3$ film. Thereafter, as a pinned layer, a film consisting of CoFeB (4 nm) and MnIr (10 m) was formed on the barrier layer.

Step 4: Patterning the Pinned Layer

As a pattern for the pinned layer, a square pattern of 1×1 μm² was transferred onto the pinned layer with an I-line stepper, and the pinned layer was formed by ion milling.

Step 5: Forming an Interlayer Insulating Film and Contact Portions

Thereafter, as an interlayer insulating film, an $Al_2O_3$ film was formed in a thickness of 15 nm. As a material of second and third contact portions, Au was used so that spin polarized electrons could be effectively detected.

Step 6: Forming Magnetic Shields

Second and third magnetic shields which also served as electrodes for voltage measurement were formed. As each of the materials of the second and third magnetic shield layers, a NiFe film (in a thickness of 100 nm) was used, and each of these magnetic shield layers was patterned into a square of 500×500 nm². Lastly, portions exposed on the record medium-facing surface were planarized by chemical mechanical polishing (CMP).

In the magnetic reading head including the second modulated spin accumulation device by magnetic field according to the present invention, the spin diffusion length of the non-magnetic free layer was successfully increased since the non-magnetic free layer was made of Cu and improved in quality. Since this increased spin diffusion length is expected to amplify an output signal from the magnetic reading head, the present invention makes it possible to provide a magnetic reading head in which magnetic noise is reduced by using Cu as a material of a free layer. Moreover, the magnetic reading head according to the present invention is easily combined with a magnetic writing head. For example, a magnetic head is provided by manufacturing the magnetic reading head after manufacturing a magnetic writing head.

Example 2

A magnetic reading head including the third modulated spin accumulation device by magnetic field (refer to FIG. 5) according to the present invention was manufactured through the steps shown in FIGS. 8A to 8F. The following steps 1 to 6 correspond to FIGS. 8A to 8F, respectively.

Step 1: Forming a Pinned Layer (Magnetic Material)

As an electrode, a Pt film was formed in a thickness of 100 nm on a Si substrate of 3 inches provided with a thermal oxide film using an RF magnetron sputtering apparatus. On the Pt electrode, a MnIr film with a thickness of 10 nm to serve as an antiferro magnetic material, a CoFeB film with a thickness of 4 nm to serve as a pinned layer were sequentially formed. Then, an MgO film with a thickness of 2 nm to serve as a barrier layer was formed on the CoFeB film. Thereafter, as a pattern for the pinned layer, a square pattern of 1×1 μm² was transferred onto the barrier layer with an I-line stepper, and the thus-formed layers were patterned by ion milling.

Step 2: Forming a Free Layer (Non-Magnetic Thin Wire)

As a material of a non-magnetic free layer, employed was Cu annealed in vacuo at 240° C. for 50 minutes. The Cu film is formed in a thickness of 300 nm using an RF magnetron sputtering apparatus.

Step 3: Patterning the Free Layer

The non-magnetic free layer was finely processed using electron beam drawing method so as to be formed into a desired shape. After the fine processing, a non-magnetic thin wire portion in contact with the medium-facing surface had a cross section area $A_1$ of 20×20 nm² and a length $L_1$ of 300 nm, and each of non-magnetic thin wire portions that were not in contact with the medium-facing surface had a cross section area $A_2$ of 20×20 nm² and a length $L_2$ of 300 nm.

Step 4: Forming an Interlayer Insulating Film

As shown in FIG. 8D, as an interlayer insulating film, an $Al_2O_3$ film was formed in a thickness of 300 nm.

Step 5: Forming a Contact Portion

A part of the interlayer insulating film was subject to milling, and thereby a contact hole in contact with the non-magnetic free layer was formed. As a material of a contact pad, Au was used so as to improve the detection efficiency of spin polarized electrons.

Step 6: Forming Magnetic Shields

A first magnetic shield which also served as an electrode for voltage measurement and a second magnetic shield which did not have a function as an electrode were formed. As a material of each magnetic shield layer, a NiFe film (at a thickness of 200 nm) was used, and a square of 500×500 nm² was used as a pattern for the both magnetic shield layers. Lastly, portions exposed on the recording medium-facing surface were planarized by CMP.

The magnetic reading head including the third modulated spin accumulation device by magnetic field according to the present invention has a structure easily combined with a planar writing head that is expected as a next-generation writing head, and can be manufactured at the same time as a writing head on the single wafer. As described above, employing the magnetic reading head manufactured by the above method makes it possible to provide a reading head characterized in ultra-high resolution and a high S/N ratio.

DESCRIPTION AND SYMBOLS 101, 204, 506 non-magnetic thin wire
102, 206, 503 magnetic metal
103, 207, 502 antiferro magnetic material
205, 504 barrier layer
201, 507 first magnetic shield
210, 508 second magnetic shield
211 third magnetic shield
202 first contact portion
208 second contact portion
209 third contact portion
509 contact portion

What is claimed is:

1. A magnetic reading head, comprising:
   a non-magnetic material having a first portion affected by an external magnetic field and a second portion not affected by the external magnetic field;
   a magnetic material stacked on a connection region between the first and second portions of the non-magnetic material;
   a means for accumulating spin polarized electrons in the first and second portions of the non-magnetic material by causing a current to flow from the magnetic material to the non-magnetic material; and
   a voltage detection means for detecting a voltage between the first and second portions.

2. The magnetic reading head according to claim 1, wherein an antiferro magnetic material is stacked on the magnetic material.

3. The magnetic reading head according to claim 1, wherein a barrier layer is provided between the non-magnetic material and the magnetic material.

4. The magnetic reading head according to claim 1, wherein
   a non-magnetic thin wire is used as the non-magnetic material, and
   a length of a voltage measurement path used by the voltage detection means is less than twice a spin diffusion length intrinsic to the non-magnetic material, the voltage measurement path extending along the non-magnetic thin wire.

5. The magnetic reading head according to claim 1, wherein the first and second portions of the non-magnetic material is outside a path of the current caused to flow from the magnetic material to the non-magnetic material.

6. The magnetic reading head according to claim 1, further comprising:
- a first magnetic shield disposed in a side opposite to a side in which the magnetic material is stacked, relative to the non-magnetic material, and connected to the non-magnetic material in a region corresponding to a back side of the magnetic material;
- a second magnetic shield disposed in the side in which the magnetic material is stacked, relative to the non-magnetic material, and connected to the first portion of the non-magnetic material; and
- a third magnetic shield disposed in the side in which the magnetic material is stacked, relative to the non-magnetic material, and connected to the second portion of the non-magnetic material, wherein
- the non-magnetic material is disposed such that the first portion is placed closer to the medium-facing surface and that the second portion is placed farther from the medium-facing surface,
- a current is caused to flow from the magnetic material to the first shield connected to the non-magnetic material, and
- the voltage detection means detects a voltage between the second and third magnetic shields.

7. The magnetic reading head according to claim 6, wherein a spin diffusion length of a material constituting a first contact portion connecting the non-magnetic material to the first magnetic shield is longer than a spin diffusion length of a material constituting a second contact portion connecting the non-magnetic material to the second magnetic shield and a spin diffusion length of a material constituting a third contact portion connecting the non-magnetic material to the third magnetic shield.

8. The magnetic reading head according to claim 6, wherein
- a barrier layer is provided between the non-magnetic material and the magnetic material, and
- an antiferro magnetic material is stacked on the magnetic material.

9. The magnetic reading head according to claim 1, further comprising:
- a first magnetic shield disposed in a side to the first portion of the non-magnetic material so as to fill a space adjacent to the second portion and closer to a medium, the first magnetic shield connected to the non-magnetic material; and
- a second magnetic shield disposed in a side to the first portion of the non-magnetic material such that the first portion is sandwiched between the first and second magnetic shields, wherein
- the non-magnetic material is disposed such that the first portion is placed closer to the medium-facing surface and that the second portion is placed so as to extend along the medium-facing surface,
- a current is caused to flow from the magnetic material to the non-magnetic material, and
- the voltage detection means detects a voltage between the second portion of the non-magnetic material and the first magnetic shield.

10. The magnetic reading head according to claim 9, wherein
- the non-magnetic material consisting of three thin wire portions connected to have a T-shaped structure,
- the first portion is a first one of the three thin wire portions that extends, to the medium-facing surface, from a connection point where the three thin wire portions are connected together,
- the second portion is a second one of the three thin wire portions that extends along the medium-facing surface from the connection point, and
- a current to be flown from the magnetic material to the non-magnetic material is caused to flow through a third one of the three wire portions that extends along the medium-facing surface from the connection point in a opposite direction to the second thin wire portion.

11. The magnetic reading head according to claim 9, wherein
- a barrier layer is provided between the non-magnetic material and the magnetic material, and
- an antiferro magnetic material is stacked on the magnetic material.

12. A magnetic recording apparatus, comprising:
- a magnetic recording medium having a magnetic recording layer;
- a driving unit which drives the magnetic recording medium;
- a magnetic head which writes to and reads from the magnetic recording medium; and
- an actuator which moves the magnetic head to a predetermined position on the magnetic recording medium, wherein
- the magnetic head including:
  - a non-magnetic material having a first portion affected by a leakage magnetic field leaked from the magnetic recording layer of the magnetic recording medium and a second portion not affected by the leakage magnetic field;
  - a magnetic material stacked on a connection region between the first and second portions of the non-magnetic material;
  - a means for accumulating spin polarized electrons in the first and second portions of the non-magnetic material by causing a current to flow from the magnetic material to the non-magnetic material; and
  - a voltage detection means for detecting a voltage between the first and second portions.

* * * * *